United States Patent
Yang et al.

(10) Patent No.: US 11,730,029 B2
(45) Date of Patent: Aug. 15, 2023

(54) DISPLAY SUBSTRATE, LIGHT FIELD DISPLAY APPARATUS AND METHOD FOR DRIVING THE SAME

(71) Applicant: BOE TECHNOLOGY GROUP CO., LTD., Beijing (CN)

(72) Inventors: Ming Yang, Beijing (CN); Minghua Xuan, Beijing (CN); Can Zhang, Beijing (CN); Can Wang, Beijing (CN); Han Yue, Beijing (CN); Ning Cong, Beijing (CN); Jiayao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 17/184,017

(22) Filed: Feb. 24, 2021

(65) Prior Publication Data
US 2021/0183952 A1    Jun. 17, 2021

Related U.S. Application Data

(63) Continuation of application No. 16/512,924, filed on Jul. 16, 2019, now Pat. No. 11,271,065.

(30) Foreign Application Priority Data

Oct. 25, 2018    (CN) .......................... 201811251738.X

(51) Int. Cl.
*H10K 59/131* (2023.01)
*G09G 3/3208* (2016.01)
(Continued)

(52) U.S. Cl.
CPC ......... *H10K 59/131* (2023.02); *G09G 3/3208* (2013.01); *G09G 3/3233* (2013.01);
(Continued)

(58) Field of Classification Search
CPC ............. H01L 27/3276; H01L 27/2481; H01L 51/5281; H01L 2251/5315; G09G 3/3208;
(Continued)

(56) References Cited

U.S. PATENT DOCUMENTS

| 7,545,347 B2 | 6/2009 | Kanda |
| 8,469,551 B2 | 6/2013 | Wolk et al. |

(Continued)

FOREIGN PATENT DOCUMENTS

| CN | 102110410 A | 6/2011 |
| CN | 102263975 A | 11/2011 |

(Continued)

OTHER PUBLICATIONS

Chinese Office Action in Chinese Application No. 201811251738.X, dated Jan. 19, 2020 with English translation.

(Continued)

*Primary Examiner* — Michael M Trinh
(74) *Attorney, Agent, or Firm* — Collard & Roe, P.C.

(57) ABSTRACT

The embodiments of the present application provide a display substrate, a light field display apparatus, and a method for driving the same. The display substrate includes: a base substrate; a light emitting block on the base substrate, wherein the light emitting block includes a plurality of first light emitting units, and each of the first light emitting units includes a plurality of first light emitting points which are located at a plurality of predetermined positions in the first light emitting unit respectively; and first driving leads each electrically connected to first light emitting points located at the same predetermined positions in the respective first light emitting units and configured to receive a first driving signal from a driving circuit.

20 Claims, 8 Drawing Sheets

(51) Int. Cl.
*H10K 50/86* (2023.01)
*G09G 3/3233* (2016.01)
*H10B 63/00* (2023.01)
*H10K 102/00* (2023.01)

(52) U.S. Cl.
CPC ............. *H10B 63/84* (2023.02); *H10K 50/86* (2023.02); *G09G 2310/0281* (2013.01); *H10K 2102/3026* (2023.02)

(58) Field of Classification Search
CPC ............... G09G 3/003; G09G 3/3233; G09G 2300/0426; G09G 2310/0281; G09G 3/32; H10K 59/131; H10K 50/86; H10K 2102/3026; H10B 63/84
See application file for complete search history.

(56) References Cited

U.S. PATENT DOCUMENTS

| | | | |
|---|---|---|---|
| 8,754,834 B2 | 6/2014 | Hasegawa | |
| 8,952,875 B2 | 2/2015 | Hasegawa | |
| 9,024,913 B1* | 5/2015 | Jung | G09G 3/3655 |
| | | | 345/174 |
| 9,754,525 B2* | 9/2017 | Wu | G09G 3/2003 |
| 9,881,549 B2 | 1/2018 | Li et al. | |
| 9,960,194 B1 | 5/2018 | Park et al. | |
| 11,271,065 B2* | 3/2022 | Yang | H01L 27/3276 |
| 2009/0179879 A1* | 7/2009 | Nozawa | G09G 3/003 |
| | | | 345/204 |
| 2011/0024760 A1* | 2/2011 | Kimura | G09G 3/3233 |
| | | | 257/E33.053 |
| 2011/0157471 A1* | 6/2011 | Seshadri | H04N 13/161 |
| | | | 348/E5.099 |
| 2012/0169688 A1 | 7/2012 | Chen et al. | |
| 2015/0156482 A1 | 6/2015 | Sun et al. | |
| 2016/0041434 A1 | 2/2016 | Qin et al. | |
| 2016/0171914 A1 | 6/2016 | Chen et al. | |
| 2016/0188063 A1 | 6/2016 | Kim | |
| 2016/0247448 A1* | 8/2016 | Toya | G09G 3/3241 |
| 2016/0254455 A1 | 9/2016 | Wang | |
| 2019/0156740 A1 | 5/2019 | Xu | |
| 2019/0236997 A1* | 8/2019 | Han | G09G 3/3208 |
| 2020/0341573 A1 | 10/2020 | Yang | |
| 2020/0348784 A1 | 11/2020 | Wu et al. | |

FOREIGN PATENT DOCUMENTS

| | | |
|---|---|---|
| CN | 103278969 A | 9/2013 |
| CN | 104155789 A | 11/2014 |
| CN | 104599641 A | 5/2015 |
| CN | 104752468 A | 7/2015 |
| CN | 107248391 A | 10/2017 |
| CN | 108205198 A | 6/2018 |
| JP | 2004-212486 A | 7/2004 |

OTHER PUBLICATIONS

Non-Final Office Action in U.S. Appl. No. 16/512,924 dated Oct. 29, 2020.

U.S. Office Action in U.S. Appl. No. 16/638,703 dated Dec. 20, 2021.

* cited by examiner

DISPLAY SUBSTRATE, LIGHT FIELD DISPLAY APPARATUS AND METHOD FOR DRIVING THE SAME

CROSS-REFERENCE TO RELATED APPLICATION(S)

This application is a continuation application of U.S. Ser. No. 16/512,924 filed on Jul. 16, 2019 which claims priority to the Chinese Patent Application No. 201811251738.X, filed on Oct. 25, 2018, which is incorporated herein by reference in its entirety.

TECHNICAL FIELD

The present application relates to the field of display technologies, and more particularly, to a display substrate, a light field display apparatus, and a method for driving the same.

BACKGROUND

Light field display has become a research hotspot in recent years. In order to obtain a better display effect, a display needs to provide a lot of light beams. In a conventional display, each sub-pixel unit corresponds to one light emitting point, which may provide a light beam to a space. A number of light beams in the space is the same as that of sub-pixel units of the display.

In the related art, due to a capability limitation corresponding to a process, sizes of the sub-pixel units may not be reduced indefinitely. By taking an Organic Light Emitting Diode (OLED) product as an example, in order to achieve a better display effect, a driving circuit usually comprises a plurality of thin film transistors, capacitors, and signal lines, which may result in large sizes of pixels. Thereby, a density of the pixels may not be improved, which makes it impossible to achieve a better light field display effect.

SUMMARY

The present application provides a display substrate, a light field display apparatus and a method for driving the same.

According to a first aspect of the present disclosure, there is provided a display substrate, comprising:
a base substrate;
a light emitting block on the base substrate, wherein the light emitting block comprises a plurality of first light emitting units, and each of the first light emitting units comprises a plurality of first light emitting points, which are located at a plurality of predetermined positions in the first light emitting unit, respectively; and
a first driving lead electrically connected to first light emitting points located at a same predetermined position in respective first light emitting units and configured to receive a first driving signal from a driving circuit.

In some embodiments, the light emitting block further comprises:
a plurality of second light emitting units, wherein each of the second light emitting units comprises a plurality of second light emitting points, which are located at a plurality of predetermined positions in the second light emitting unit, respectively; and
a second driving lead electrically connected to second light emitting points located at a same predetermined position in respective second light emitting units and configured to receive a second driving signal from the driving circuit.

In some embodiments, the first light emitting units are left-eye light emitting units, and the second light emitting units are right-eye light emitting units; and
the first light emitting points are left-eye light emitting points, and the second light emitting points are right-eye light emitting points.

In some embodiments, the plurality of first light emitting units and the plurality of second light emitting units are alternately arranged in a set direction.

In some embodiments, the first driving leads and the second driving leads are arranged in a first direction.

In some embodiments, the display substrate further comprises:
a plurality of first branch leads and a plurality of second branch leads, wherein the first branch leads and the second branch leads are arranged in a second direction intersecting the first direction respectively,
wherein the first driving lead is electrically connected to the first light emitting points located at the same predetermined position in the respective first light emitting units through the plurality of first branch leads, respectively, and the second driving lead is electrically connected to the second light emitting points located at the same predetermined position in the respective second light emitting units through the plurality of second branch leads, respectively.

In some embodiments, the set direction is a horizontal direction, the first direction is a vertical direction, and the second direction is a horizontal direction.

In some embodiments, the light emitting block is a single light emitting block or a plurality of light emitting blocks arranged in a matrix form,
the plurality of first light emitting units in the light emitting block are arranged in a matrix form, and the plurality of second light emitting units in the light emitting block are arranged in a matrix form, and
the plurality of first light emitting points in each first light emitting unit are arranged in a matrix form, and the plurality of second light emitting points in each second light emitting unit are arranged in a matrix form.

In some embodiments, the display substrate is a self-luminous type top emission display substrate.

According to a second aspect of the present disclosure, there is provided a light field display apparatus, comprising:
the display substrate according to the first aspect, and
a light angle adjustment structure located on a light emitting side of the display substrate and configured to deflect light emitted from the first light emitting points electrically connected to a same first driving lead to different directions.

In some embodiments, the light angle adjustment structure is further configured to deflect light emitted from second light emitting points electrically connected to the same second driving lead to different directions.

In some embodiments, the light angle adjustment structure comprises micro-lenses disposed in correspondence to the light emitting block.

According to a third aspect of the present disclosure, there is provided a method for driving the light field display apparatus according to the second aspect, comprising:
receiving a first driving signal from a driving circuit through the first driving lead; and
deflecting, by the light angle adjustment structure, light emitted from the first light emitting points electrically connected to a same first driving lead to different directions.

In some embodiments, the method further comprises:

receiving a second driving signal from the driving circuit through the second driving lead; and deflecting, by the light angle adjustment structure, light emitted from the second light emitting points electrically connected to a same second driving lead to different directions.

In some embodiments, for 2D display, the first driving signal is the same as the second driving signal, and for 3D display, the first driving signal is a left-eye driving signal, and the second driving signal is a right-eye driving signal.

Additional aspects and advantages of the present application will be set forth in part in the following description, will become apparent from the following description, or may be understood through the practice of the present application.

BRIEF DESCRIPTION OF THE DRAWINGS

The above and/or additional aspects and advantages of the present application will become apparent and readily understood from the following description of the embodiments in conjunction with the accompanying drawings, in which.

DETAILED DESCRIPTION

The embodiments of the present application will be described in detail below, and examples of the embodiments are illustrated in the accompanying drawings, wherein the same or similar reference signs are used to refer to the same or similar elements or elements having the same or similar functions. The embodiments described below with reference to the accompanying drawings are intended to be illustrative, are merely used to explain the present application, and are not to be construed as limiting the present application.

It may be understood by those skilled in the art that singular forms "a", "an", "the" used here may also comprise plural forms, unless otherwise stated. It should also be understood that phrase "comprise" used in the specification of the present disclosure refers to presence of the features, integers, steps, operations, elements and/or components, but should not preclude the presence or addition of one or more other features, integers, steps, operations, elements, components, and/or groups thereof. It should be understood that when an element is referred to as being "connected" to another element, it may be directly connected to the other element, or there may be an intermediate element therebetween. Further, "connected" as used here may comprise either a wireless connection. The phrase "and/or" used here comprises all or any of one or more of associated listed items, or all combinations thereof.

The technical solutions according to the present application will be described in detail below using specific embodiments. In the following specific embodiments, the same or similar concepts or processes may not be described in detail in some embodiments.

Shapes and sizes of components in the accompanying drawings do not reflect actual conditions of the components, but are merely illustrative of the embodiments of the present application.

Figure 1:
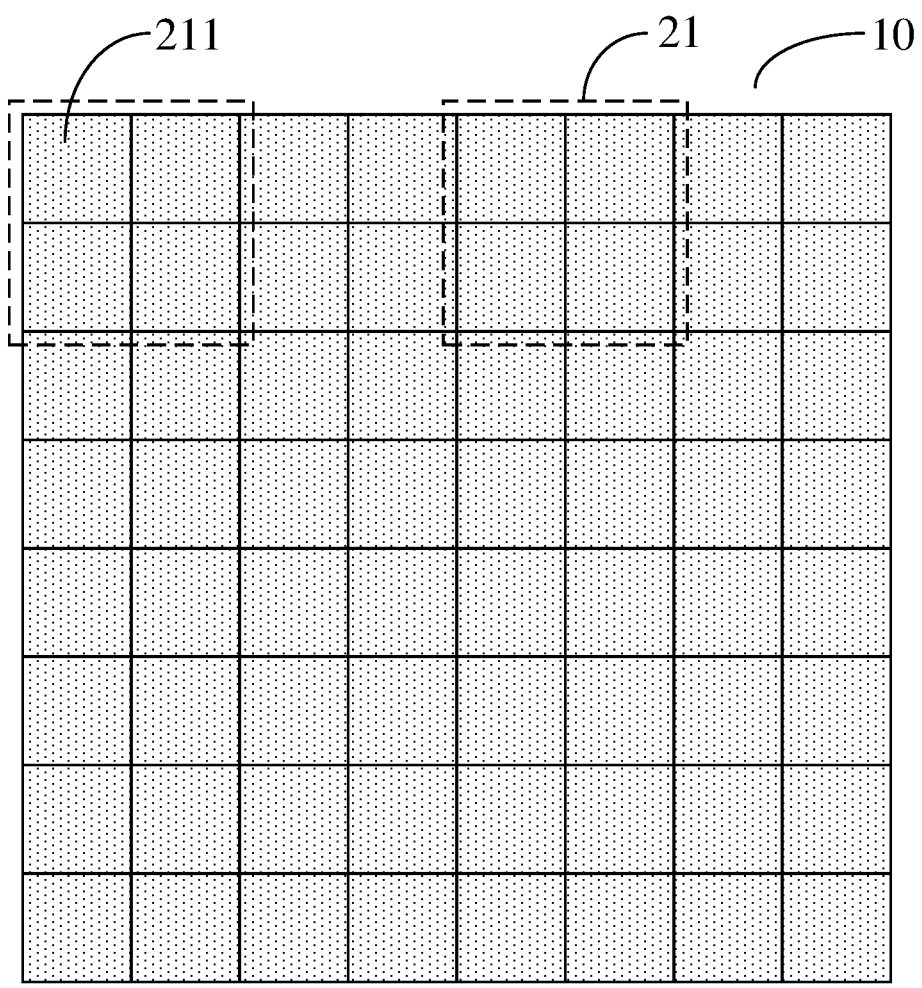
FIG. 1 is a schematic structural diagram of a display substrate according to an embodiment of the present application.
Figure 2:
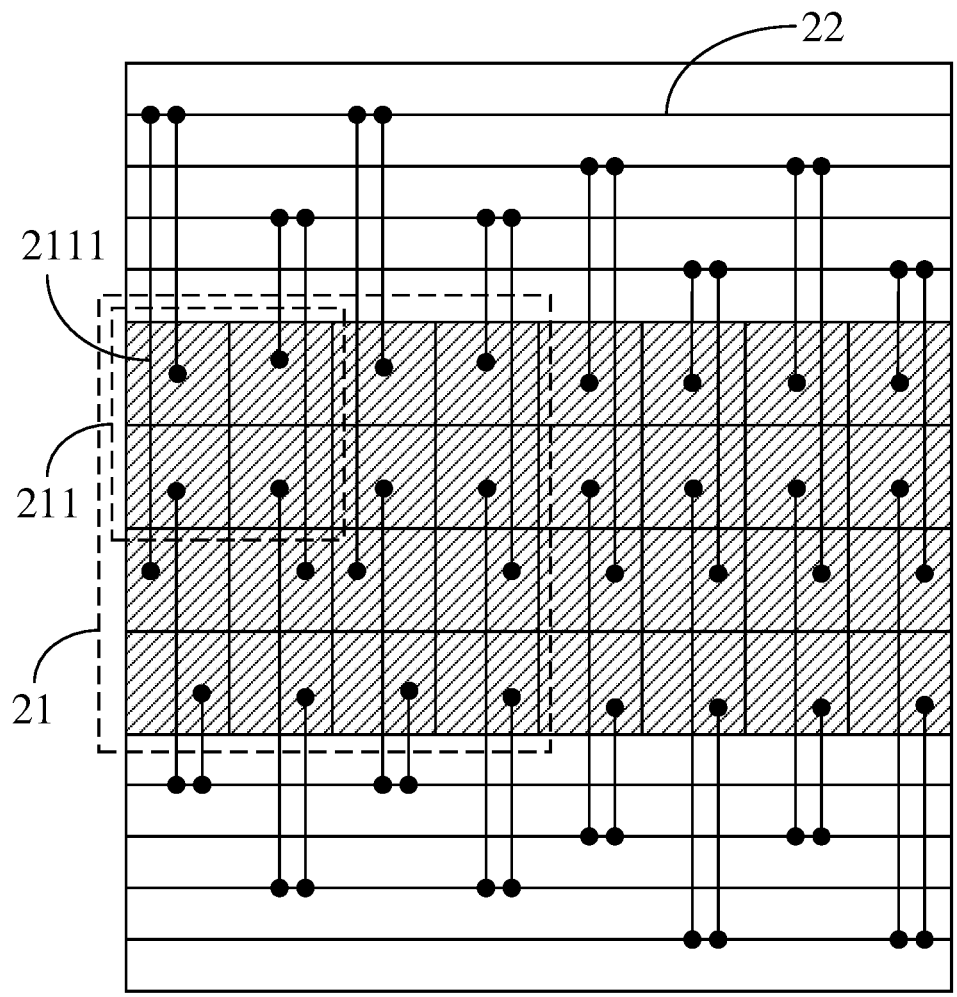
FIG. 2 is a schematic structural diagram of a specific wiring of first light emitting units in a light emitting block according to an embodiment of the present application.

As shown in FIG. 1 and FIG. 2, FIG. 1 is a schematic structural diagram of a display substrate according to an embodiment of the present application, and FIG. 2 is a schematic structural diagram of a specific wiring of light emitting units included in a light emitting block. The display substrate comprises a base substrate 10, at least one light emitting block 21 on the base substrate 10, and a plurality of first driving leads 22.

Each of the light emitting blocks 21 comprises a plurality of first light emitting units 211 (for example, four first light emitting units 211 as shown), and each of the first light emitting units 211 comprises a plurality of first light emitting points 2111 (for example, four first light emitting points 2111 as shown) located at a plurality of predetermined positions in the first light emitting unit 211 respectively.

In FIG. 1 and FIG. 2, as an example, the light emitting blocks 21 are arranged in a matrix form, the plurality of first light emitting units 211 in each of the light emitting blocks 21 are arranged in a matrix form, the plurality of first light emitting points 2111 in each of the first light emitting units 211 are arranged in a matrix form. In this case, the predetermined positions may be determined by rows and columns in the matrix.

Each of the first driving leads 22 is electrically connected to first light emitting points 2111 at the same predetermined positions in the respective first light emitting units 211 and is configured to receive a first driving signal from a driving circuit.

Specifically, in the embodiment of the present application, first light emitting points located at the same positions in different light emitting blocks are connected to different first driving leads. In a specific implementation, a light emitting unit composed of first light emitting points connected to the same first driving lead 22 corresponds to one sub-pixel unit on the display substrate, and colors of light emitted from the first light emitting points may comprise red, green, and blue, or, of course, other colors such as yellow.

The display substrate according to the embodiment of the present application comprises: a base substrate; a light emitting block on the base substrate, wherein the light emitting block comprises a plurality of first light emitting units, and each of the first light emitting units comprises a plurality of first light emitting points located at a plurality of predetermined positions in the first light emitting unit respectively; and first driving leads electrically connected to first light emitting points located at the same predetermined positions in the respective first light emitting units and configured to receive a first driving signal from a driving circuit. Therefore, in the embodiment of the present application, any of the first driving leads may drive a plurality of first light emitting points to emit light at the same time. Compared with the related art, in the embodiment of the present application, a number of light emitting points is significantly improved, and a number of light beams in the space which may be provided is significantly improved, so that a better light field display effect may be achieved.

Specifically, as shown in FIG. 2, two light emitting blocks 21 are shown in FIG. 2, each of the light emitting blocks 21 comprises four first light emitting units 211, and each of the first light emitting units 211 comprises four first light emitting points 2111. In a first one of the light emitting blocks 21, a first light emitting point 2111 located at an upper left corner of each of the first light emitting units 211 is connected to a $1^{st}$ first driving lead 22 from top to bottom; a first light emitting point 2111 located at an upper right corner of each of the first light emitting units 211 is connected to a $3^{rd}$ first driving lead 22 from top to bottom; a first light emitting point 2111 located at a lower left corner of each of the first light emitting units 211 is connected to a $5^{th}$ first driving lead 22 from top to bottom; and a first light emitting point 2111 located at a lower right corner of each of the first light emitting units 211 is connected to a $7^{th}$ first driving lead 22 from top to bottom.

As shown in FIG. 2, in a second one of the light emitting blocks 21, a first light emitting point 2111 located at an upper left corner of each of the first light emitting units 211 is connected to a $2^{nd}$ first driving lead 22; a first light emitting point 2111 located at an upper right corner of each of the first light emitting units 211 is connected to a $4^{th}$ first driving lead 22; a first light emitting point 2111 located at a lower left corner of each of the first light emitting units 211 is connected to a $6^{th}$ first driving lead 22; and a first light emitting point 2111 at a lower right corner of each of the first light emitting units 211 is connected to an $8^{th}$ first driving lead 22.

Specifically, in the embodiment of the present application, the display substrate is a self-luminous type top emission display substrate. In a specific implementation, the display substrate may be a top emission OLED display substrate, or may be a Quantum dot Light Emitting Diode (Q-LED) display substrate, or may also be a top emission LED display substrate. A driving circuit of the self-luminous type top emission display substrate is disposed on a side of the light emitting points away from a light emitting side, so that the arrangement of the driving leads may not affect a light emitting efficiency of the display substrate, and a resolution of the display substrate may be improved.

Figure 3:
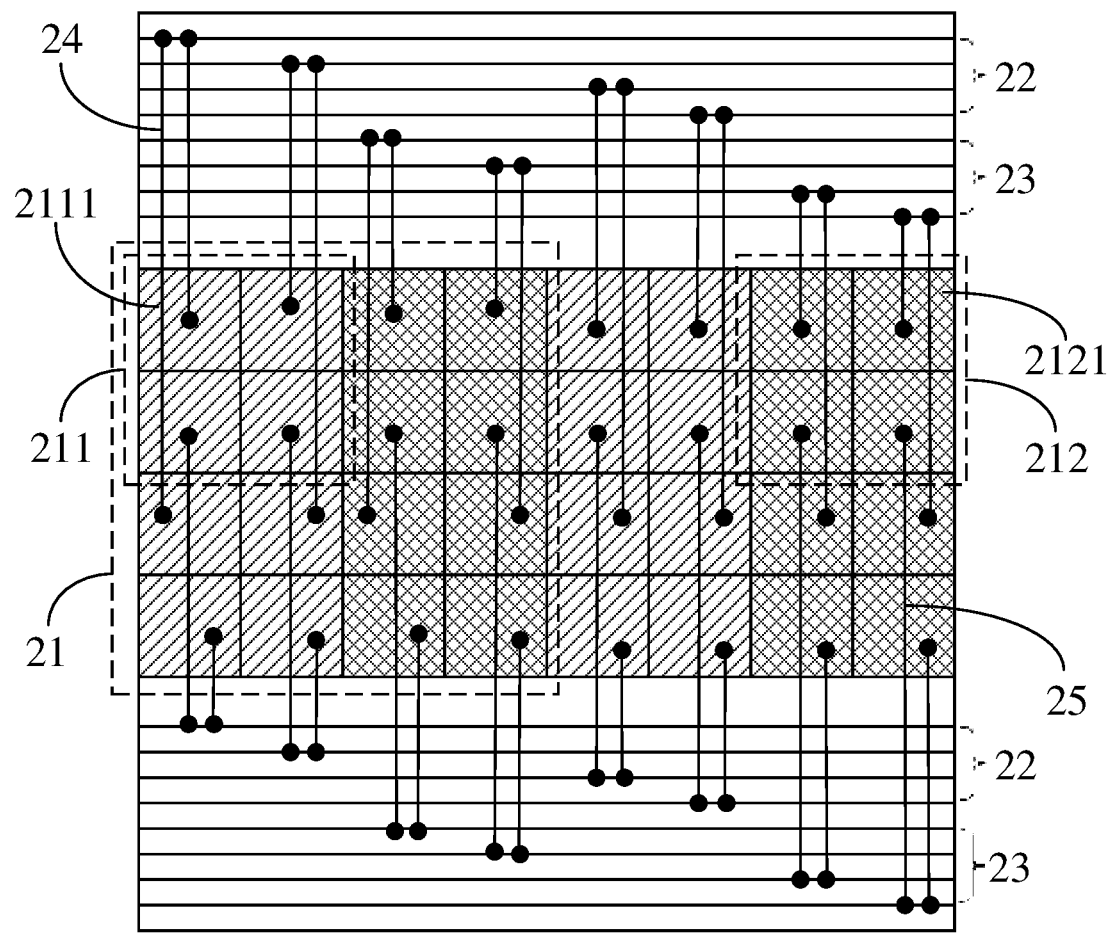
FIG. 3 is a schematic structural diagram of a specific wiring of first light emitting units and second light emitting units in a light emitting block according to an embodiment of the present application.

Further, in the embodiment of the present application, in order to realize 3D display by the display substrate, as shown in FIG. 3, each of the light emitting blocks 21 further comprises a plurality of second light emitting units 212, and each of the second light emitting units 212 comprises a plurality of second light emitting points 2121 located at a plurality of predetermined positions in the light emitting unit 212 respectively.

Similarly, as an example, the plurality of second light emitting units 212 in each of the light emitting blocks 21 are arranged in a matrix form and the plurality of second light emitting points 2121 in each of the second light emitting units 212 are arranged in a matrix form.

Specifically, for 3D display, the first light emitting units 211 are left-eye light emitting units, and the second light emitting units 212 are right-eye light emitting units; and the first light emitting points 2111 are left-eye light emitting points, and the second light emitting points 2121 are right-eye light emitting points.

In some embodiments, as shown in FIG. 3, the display substrate according to the embodiment of the present application further comprises a plurality of second driving leads 23, wherein each of the second driving leads 23 is electrically connected to second light emitting points 2121 located at the same predetermined positions in the respective second light emitting units 212, and is configured to receive a second drive signal from the driving circuit.

Specifically, as shown in FIG. 3, two light emitting blocks 21 are shown in FIG. 3, and each of the light emitting blocks 21 comprises two first light emitting units 211 and two second light emitting units 212, each of the first light emitting units 211 comprises four first light emitting points 2111, and each of the second light emitting units 212 comprises four second light emitting points 2121.

As shown in FIG. 3, in a first one of the light emitting blocks 21, a first light emitting point 2111 located at an upper left corner of each of the first light emitting units 211 is connected to a $1^{st}$ first driving lead 22 from top to bottom; a first light emitting point 2111 located at an upper right corner of each of the first light emitting units 211 is connected to a $2^{nd}$ first driving lead 22 from top to bottom; a first light emitting point 2111 located at a lower left corner of each of the first light emitting units 211 is connected to a $5^{th}$ first driving lead 22 from top to bottom; and a first light emitting point 2111 located at a lower right corner of each of the first light emitting units 211 is connected to a $6^{th}$ first driving lead 22 from top to bottom; and in a second one of the light emitting blocks 21, a light emitting point 2111 located at an upper left corner of each of the first light emitting units 211 is connected to a $3^{rd}$ first driving lead 22 from top to bottom; a first light emitting point 2111 located at an upper right corner of each of the first light emitting units 211 is connected to a $4^{th}$ first driving lead 22 from top to bottom; a first light emitting point 2111 located at a lower left corner of each of the first light emitting units 211 is connected to a $7^{th}$ first driving lead 22 from top to bottom; and a first light emitting point 2111 located at a lower right corner of each of the first light emitting units 211 is connected to an $8^{th}$ first driving lead 22 from top to bottom.

As shown in FIG. 3, in the first light emitting block 21, a second light emitting point 2121 located at the upper left corner of each of the second light emitting units 212 is connected to a $1^{st}$ second driving lead 23 from top to bottom; a second light emitting point 2121 located at the upper right corner of each of the second light emitting units 212 is connected to a $2^{nd}$ second driving lead 23 from top to bottom; a second light emitting point 2121 located at the lower left corner of each of the second light emitting units 212 is connected to a $5^{th}$ second driving lead 23 from top to bottom; and a second light emitting point 2121 located at the lower right corner of each of the second light emitting units 212 is connected to a $6^{th}$ second driving lead 23 from top to bottom; and in the second light emitting block 21, a second light emitting point 2121 located at the upper left corner of each of the second light emitting units 212 is connected to a $3^{rd}$ second driving lead 23 from top to bottom; a second light emitting point 2121 located at the upper right corner of each of the second light emitting units 212 is connected to a $4^{th}$ second driving lead 23 from top to bottom; a second light emitting point 2121 located at the lower left corner of each of the second light emitting units 212 is connected to a $7^{th}$ second driving lead 23 from top to bottom; and a second light emitting point 2121 located at the lower right corner of each of the second light emitting units 212 is connected to an 8$^{th}$ second driving lead 23 from top to bottom.

In a specific implementation, in the embodiment of the present application, a number of the first light emitting units 211 is equal to that of the second light emitting units 212, and a specific number of the first light emitting points 2111 included in each of the first light emitting units 211 and a specific number of the second light emitting points 2121 included in each of the second light emitting units 2121 are set according to practical production process conditions, and in a case where the process allows, the first light emitting points 2111 and the second light emitting points 2121 are set as many as possible.

In some embodiments, as shown in FIG. 3, the display substrate according to the embodiment of the present application further comprises a plurality of first branch leads 24 and a plurality of second branch leads 25, wherein each of the first light emitting points 2111 is connected to a corresponding one of the first driving leads 22 through a corresponding one of the first branch leads 24, that is, each of the first branch leads 24 is connected to a corresponding one of the first light emitting points 2111; and each of the second light emitting points 2121 is connected to a corresponding one of the second driving leads 23 through a corresponding one of the second branch leads 25, that is, each of the second branch leads 25 is connected to a corresponding one of the second light emitting points 2121.

Figure 4:
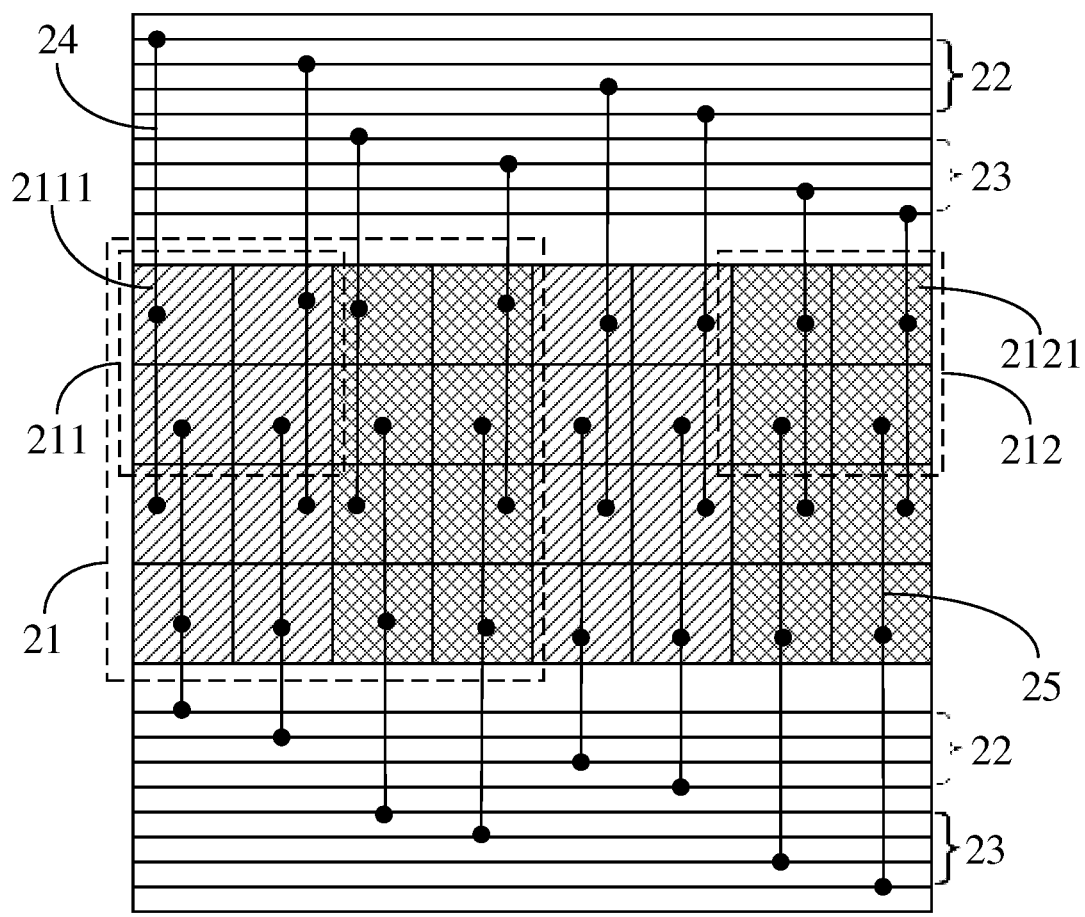
FIG. 4 is a schematic structural diagram of another specific wiring of first light emitting units and second light emitting units in a light emitting block according to an embodiment of the present application.

In some other embodiments, as shown in FIG. 4, the display substrate according to the embodiment of the present application further comprises a plurality of first branch leads 24 and a plurality of second branch leads 25, wherein each of the first branch leads 24 is connected to all the first light emitting points 2111 which are connected to the same first driving lead 22 in an extending direction of the first branch lead 24, and each of the second branch leads 25 is connected to all the second light emitting points 2121 which are connected to the same second driving lead 23 in an extending direction of the second branch lead 25. With this arrangement, the same column of first light emitting units are enabled to correspond to the same picture during display and the same column of second light emitting units are enabled to correspond to the same picture during display using a small number of branch leads. In this way, when a person raises or lowers his/her head without movement, a viewing angle at which an object or a picture is viewed does not change, which may correspond to a case where a viewing angle at which an object or a picture is viewed does not change.

In a specific implementation, in the embodiment of the present application, the first driving leads and the second driving leads extend in a horizontal direction, and the first branch leads and the second branch leads extend in a vertical direction. Of course, in practical design, the first driving leads, the second driving leads, the first branch leads, and the second branch leads may also not be configured as straight lines but may be configured as curved lines or broken lines.

In some embodiments, as shown in FIGS. 3 and 4, the first driving leads 22 and the second driving leads 23 are arranged in a first direction (in the vertical direction as shown), the first branch leads 24 and the second branch leads 25 are arranged in a second direction (in the horizontal direction as shown), and in each of the light emitting blocks 21, when a number of the first light emitting points 2111 included in each of the first light emitting unit 211 is m times n, and a number of the second light emitting points 2121 included in each of the second light emitting units 212 is m times n, a number of first driving leads 22 corresponding to the light emitting block is m times n, and a number of second driving leads 23 corresponding to the light emitting block is m times n, where m and n are both positive numbers greater than 1. In FIGS. 3 and 4, an example in which m is equal to 2 and n is equal to 2 is illustrated for description. In this case, the number of the first driving leads 22 and the number of the second driving leads corresponding to each of the light emitting blocks are both illustrated as four. In FIGS. 3 and 4, there are illustrated two light emitting blocks, and thus there are illustrated eight first driving leads 22 and eight second driving leads 23.

Figure 5:
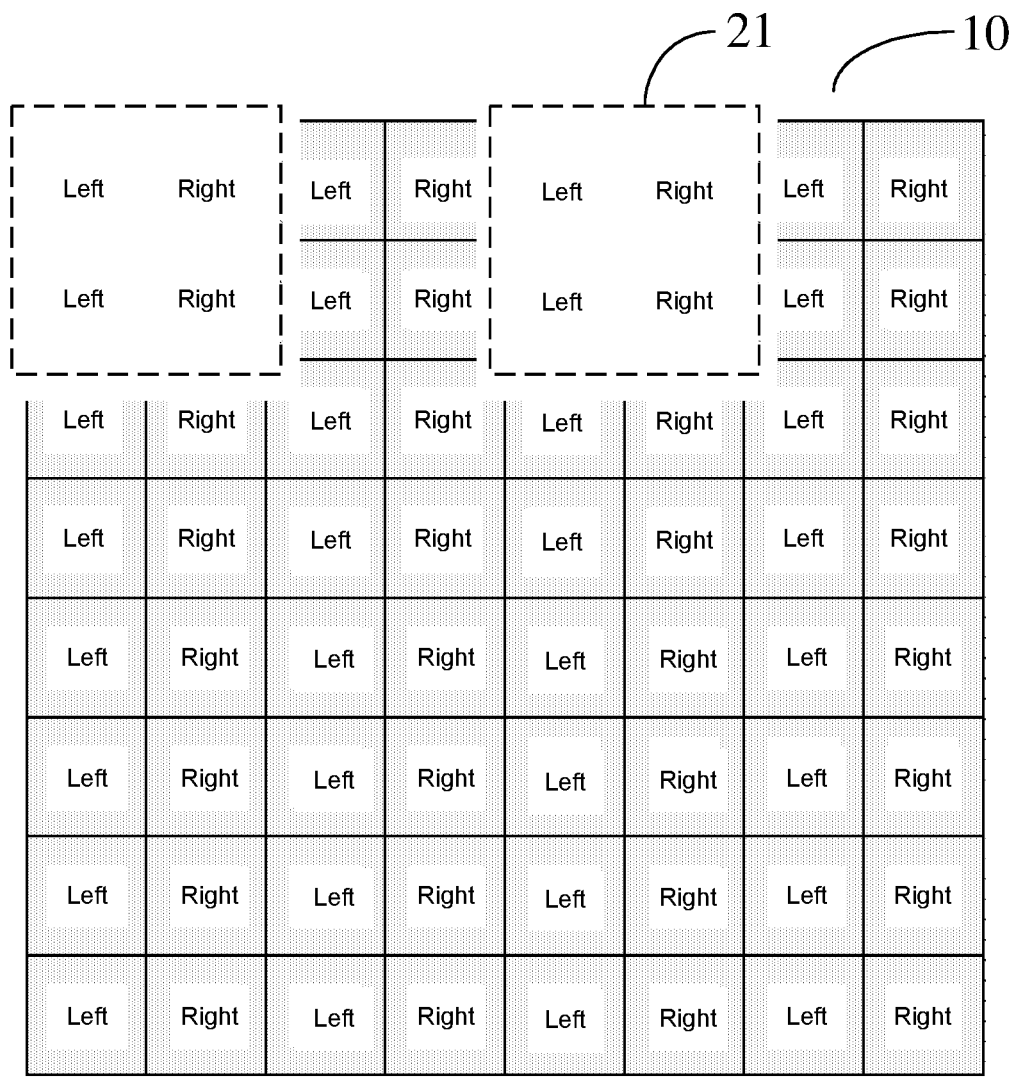
FIG. 5 is a schematic structural diagram of another display substrate according to an embodiment of the present application.

In some embodiments, as shown in FIG. 5, in a set direction, left-eye light emitting units and right-eye light emitting units are alternately arranged, wherein the set direction refers to a direction which is set for the entire display substrate, and is specifically the horizontal direction. That is, in the entire display substrate, the left-eye light emitting units and the right-eye light emitting units are alternately arranged in the horizontal direction. The left-eye light emitting units are used for displaying an image for a left eye, and the right-eye light emitting units are used for displaying an image for a right eye.

In some embodiments, as shown in FIG. 5, in the embodiment of the present application, when the number of the light emitting blocks 21 is more than two, the light emitting blocks 21 are arranged in a matrix form. In some embodiments, the light emitting blocks 21 are arranged all over the entire display substrate in a matrix form.

Specifically, in the embodiment of the present application, the first driving leads and the second driving leads are connected to an output terminal of a driving circuit, which specifically comprises a plurality of thin film transistors, capacitors, and signal lines (such as scanning signal lines, data signal lines, power signal lines, etc.) Since the improvement of the present application does not involve the thin film transistors, the capacitors, and the signal lines in the driving circuit, they will not be described in detail here.

In some embodiments, the embodiments of the present disclosure further provide a method for manufacturing a display substrate, specifically comprising: manufacturing, on a base substrate, a plurality of first light emitting units, a plurality of second light emitting units, a plurality of first driving leads, a plurality of second driving leads, a plurality of first branch leads, and a plurality of second branch leads. Specifically, the first driving leads and the second driving leads extend in the horizontal direction, the first branch leads and the second branch leads extend in the vertical direction, each of the first light emitting units comprises a plurality of first light emitting points, and each of the second light emitting units comprises a plurality of second light emitting points.

In a specific implementation, in the embodiment of the present application, the first light emitting units and the second light emitting units may be firstly manufactured, or the first driving leads, the second driving leads, the first branch leads, and the second branch leads may be firstly manufactured. A specific method for manufacturing the light emitting units and the second light emitting units is similar to those in the related art, and will not be described in detail here. For example, the first light emitting points in the first light emitting units and the second light emitting points in the second light emitting units may be manufactured in a current manner of manufacturing quantum dot light emitting points.

In a specific implementation, the first driving leads, the second driving leads, the first branch leads, and the second branch leads may be manufactured using a patterning process. In the embodiment of the present application, the patterning process comprises some or all of coating, exposure, development, etching, and removal of photoresist.

Figure 6:
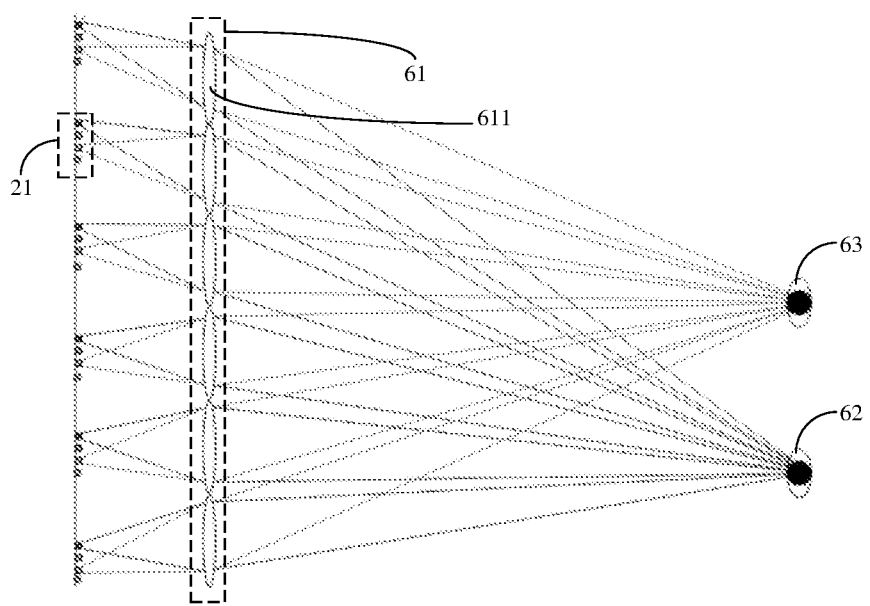
FIG. 6 is a schematic structural diagram of a light field display apparatus according to an embodiment of the present application.

Based on the same concept, the embodiments of the present disclosure further provide a light field display apparatus. As shown in FIG. 6, the display apparatus comprises: the display substrate according to the embodiments of the present application; and a light angle adjustment structure 61 located on a light emitting side of the display substrate and configured to deflect light emitted from first light emitting points electrically connected to the same first driving lead to different directions.

In some embodiments, the light angle adjustment structure 61 is further configured to deflect light emitted from second light emitting points 2121 electrically connected to the same second driving lead 23 to different directions.

Specifically, as shown in FIG. 6, in the embodiment of the present application, the light angle adjustment structure 61 comprises a plurality of micro-lenses 611, wherein a position of one light emitting block 21 corresponds to a position of one micro-lens 611. Of course, in practical design, a position of one light emitting block 21 may also correspond to positions of a plurality of micro-lenses 611.

Specifically, in the embodiment of the present application, one light emitting block 21 comprises a plurality of first light emitting units and a plurality of second light emitting units, and the micro-lenses 611 may enable light emitted by the first light emitting units to enter a left eye 62 of a person, and may enable light emitted by the second light emitting units to enter a right eye 63 of the person. In the embodiment of the present application, light emitted from first light emitting points connected to the same first driving lead is deflected to different directions and light emitted from second light emitting points connected to the same second driving lead is deflected to different directions by the micro-lenses 611 disposed in correspondence to the light emitting block 21. In this way, human eyes may only view an image corresponding to one first light emitting unit and an image corresponding to one second light emitting unit in the same viewing angle in the same light emitting block 21.

Figure 7:
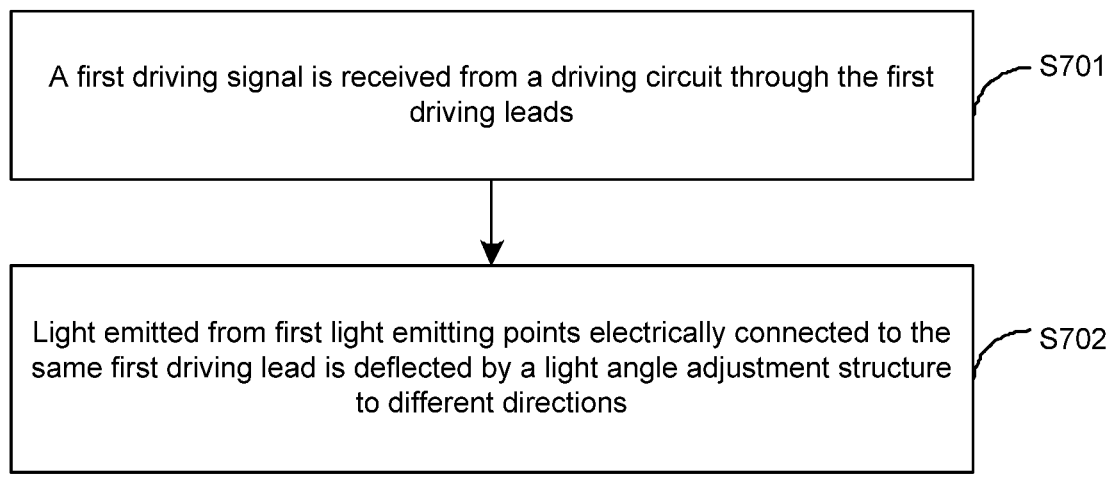
FIG. 7 is a flowchart of a method for driving a light field display apparatus according to an embodiment of the present application.

Based on the same concept, the embodiments of the present disclosure further provide a method for driving the light field display apparatus described above. As shown in FIG. 7, the method comprises the following steps.

In S701, a first driving signal is received from a driving circuit through the first driving leads.

In S702, light emitted from first light emitting points electrically connected to the same first driving lead is deflected by a light angle adjustment structure to different directions.

Figure 8:
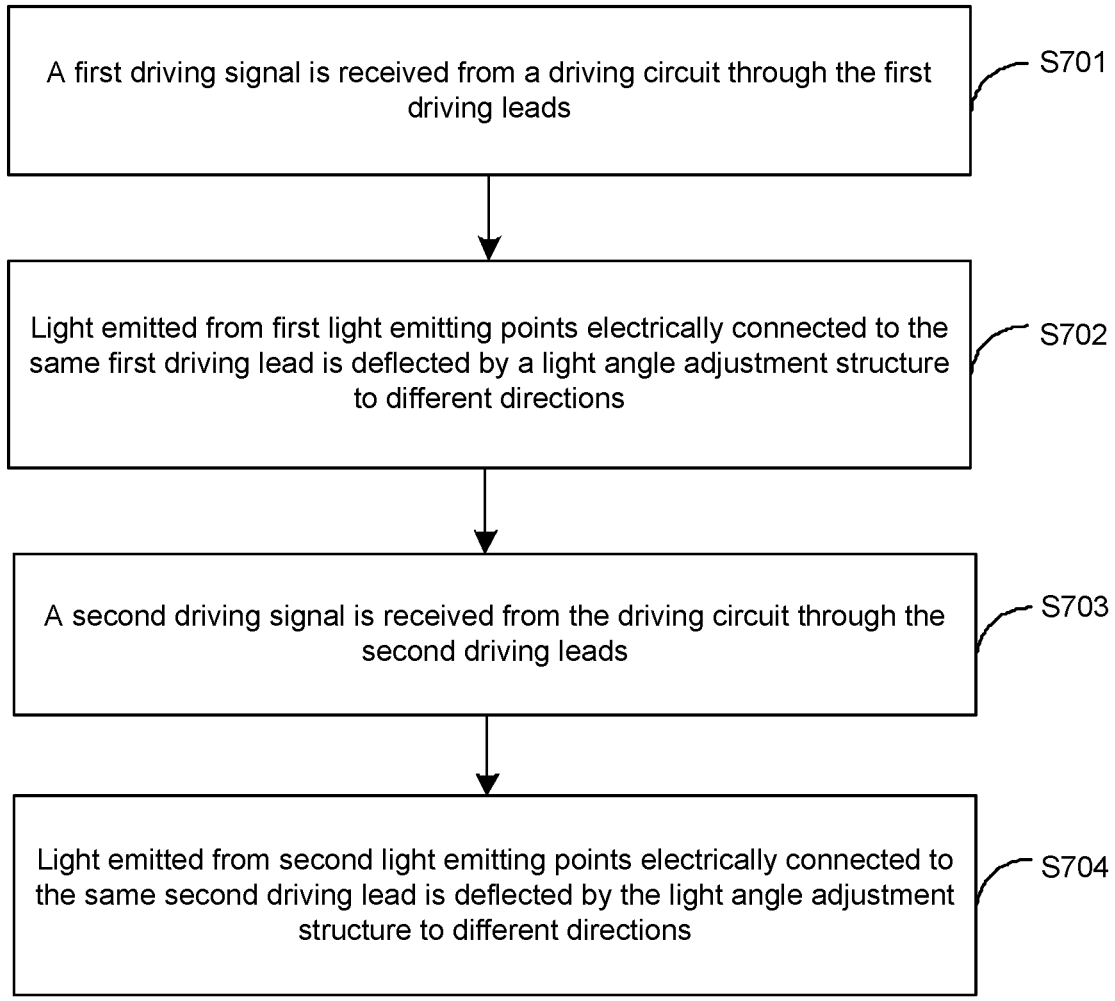
FIG. 8 is a flowchart of another method for driving a light field display apparatus according to an embodiment of the present application.

In some embodiments, the display substrate according to the embodiment of the present application further comprises the second light emitting units, the second light emitting points, and the second driving leads as described above. In this case, as shown in FIG. 8, the method further comprises the following steps.

In S703, a second driving signal is received from the driving circuit through the second driving leads.

In S704, light emitted from second light emitting points electrically connected to the same second driving lead is deflected by the light angle adjustment structure to different directions.

In the embodiment of the present application, during 2D display, the first driving signal is the same as the second driving signal, that is, the same driving signal is received through the first driving leads and the second driving leads, and during 3D display, the first driving signal is a left-eye driving signal, and the second driving signal is a right-eye driving signal, that is, the left-eye driving signal is received through the first driving leads, and the right-eye driving signal is received through the second driving leads.

In the embodiment of the present application, one first driving lead may drive a plurality of different first light emitting points to emit light, and one second driving lead may drive a plurality of different second light emitting points to emit light. Compared with the related art, in the embodiment of the present application, a number of light emitting points is significantly improved, and a number of light beams in the space which may be provided is significantly improved, so that a better light field display effect may be achieved.

In summary, the display substrate according to the specific embodiment of the present application has the following advantages.

Firstly, the display substrate according to the embodiment of the present application comprises at least one light emitting block on a base substrate and a plurality of first driving leads, wherein each of the light emitting blocks comprises a plurality of first light emitting units, and each of the first light emitting units comprises a plurality of first light emitting points. In each of the light emitting blocks, first light emitting points located at the same positions in the respective first light emitting units are connected to the same first driving lead, which are used to receive a first driving signal output from a driving circuit. In the embodiment of the present disclosure, one of the first driving leads may drive a plurality of first light emitting points to emit light at the same time. Compared with the related art, in the embodiment of the present application, a number of light emitting points is significantly improved, and a number of light beams in the space which may be provided is significantly improved, so that a better light field display effect may be achieved.

Secondly, the display substrate according to the embodiment of the present application is a self-luminous type top emission display substrate, so that the arrangement of the driving leads and the branch leads may not affect a light emitting efficiency of the display substrate, and a resolution of the display substrate may be improved.

Thirdly, the display substrate according to the embodiment of the present application further comprises a plurality of second driving leads, which are used to receive a second driving signal output by the driving circuit, wherein each of the light emitting blocks further comprises a plurality of second light emitting units, and each of the second light emitting units comprises a plurality of second light emitting points. In each of the light emitting blocks, second light emitting points located at the same positions in the respective second light emitting units are connected to the same second driving lead. In the embodiment of the present application, one of the second driving leads may drive a plurality of second light emitting points to emit light at the same time. Compared with the related art, in the embodiment of the present application, a number of light emitting points is significantly improved, and a number of light beams in the space which may be provided is significantly improved, so that a better light field display effect may be achieved.

The above description is only a part of the embodiments of the present application, and it should be pointed out that those of ordinary in the art may make various modifications without departing from the principles of the present application, and these modifications should also be considered to fall within the protection scope of the present application.

The invention claimed is:

1. A display substrate, comprising:
a base substrate;
a light emitting block on the base substrate, wherein the light emitting block comprises a plurality of light emitting units, and each of the light emitting units comprises a plurality of light emitting points;
a plurality of branch leads, wherein each of the plurality of branch leads extends in a first direction, wherein one of the plurality of branch leads is connected to at least one of the plurality of light emitting points,
the plurality of branch leads comprise a first lead and a second lead, the plurality of light emitting points comprise a first light emitting component and a second light emitting component, the first light emitting component and the second light emitting component are adjacent to each other and are arranged in the first direction, the first lead goes across the first light emitting component and is connected to the second light emitting component, the second lead goes across the second light emitting component and is connected to the first light emitting component, and the first lead and the second lead are two different leads,
the display substrate further comprises a plurality of driving leads, wherein each of the plurality of driving leads extends in a second direction, wherein the driving lead is electrically connected to the at least one of the plurality of light emitting points through at least one of the plurality of branch leads and configured to receive a driving signal from a driving circuit, the second direction intersects the first direction,
wherein two driving leads among the plurality of driving leads that are respectively connected to the first light emitting component and the second light emitting component are arranged at opposite sides of the light emitting block, respectively.

2. The display substrate according to claim 1,
wherein an orthographic projection of the driving lead on the base substrate is located outside an orthographic projection of the light emitting block on the base substrate.

3. The display substrate according to claim 2, wherein the plurality of light emitting units comprise a plurality of first light emitting units, and each of the first light emitting units comprises a plurality of first light emitting points, which are located at a plurality of predetermined positions in the first light emitting unit, respectively; and
the plurality of driving leads comprise a plurality of first driving leads, and each of the plurality of first driving leads is electrically connected to first light emitting points located at a same predetermined position in respective first light emitting units and configured to receive a first driving signal from the driving circuit.

4. The display substrate according to claim 3, wherein the plurality of light emitting units further comprise a plurality of second light emitting units, wherein each of the second light emitting units comprises a plurality of second light emitting points, which are located at a plurality of predetermined positions in the second light emitting unit, respectively; and
the plurality of driving leads comprise a plurality of second driving leads, and each of the plurality of second driving leads is electrically connected to second light emitting points located at a same predetermined position in respective second light emitting units and configured to receive a second driving signal from the driving circuit.

5. The display substrate according to claim 4, wherein the plurality of first light emitting units and the plurality of second light emitting units are alternately arranged in the second direction.

6. The display substrate according to claim 4, wherein
the plurality of branch leads comprise a plurality of first branch leads and a plurality of second branch leads, wherein the first branch leads and the second branch leads are arranged in the second direction, respectively,
wherein the first driving lead is electrically connected to the first light emitting points located at the same predetermined position in the respective first light emitting units through the plurality of first branch leads, respectively, and the second driving lead is electrically connected to the second light emitting points located at the same predetermined position in the respective second light emitting units through the plurality of second branch leads, respectively.

7. The display substrate according to claim 4, wherein the light emitting block is a single light emitting block or a plurality of light emitting blocks arranged in a matrix form,
the plurality of first light emitting units in the light emitting block are arranged in a matrix form, and the plurality of second light emitting units in the light emitting block are arranged in a matrix form, and
the plurality of first light emitting points in each first light emitting unit are arranged in a matrix form, and the plurality of second light emitting points in each second light emitting unit are arranged in a matrix form.

8. The display substrate according to claim 1, wherein the first lead is not connected to the first light emitting component, and the second lead is not connected to the second light emitting component.

9. The display substrate according to claim 1, wherein the plurality of light emitting points further comprise a third light emitting component, wherein the third light emitting component, the first light emitting component, and the second light emitting component are arranged in sequence in the first direction, an orthographic projection of the first lead on the base substrate overlaps with an orthographic projection of the third light emitting component on the base substrate, and an orthographic projection of the second lead on the base substrate is located outside an orthographic projection of the third light emitting component on the base substrate.

10. The display substrate according to claim 9, wherein the plurality of light emitting points further comprise a fourth light emitting component, wherein the third light emitting component, the first light emitting component, the second light emitting component, and the fourth light emitting component are arranged in sequence in the first direction,
an orthographic projection of the second lead on the base substrate overlaps with an orthographic projection of the fourth light emitting component on the base substrate, and an orthographic projection of the first lead on the base substrate is located outside an orthographic projection of the fourth light emitting component on the base substrate.

11. The display substrate according to claim 1, wherein a spacing between the two driving leads that are respectively connected to the first light emitting component and the second light emitting component is greater than a maximum size of the light emitting block in the first direction.

12. The display substrate according to claim 1, wherein the plurality of branch leads comprise a third lead and a fourth lead, the plurality of light emitting points comprise a fifth light emitting component and a sixth light emitting component, the fifth light emitting component is adjacent to the first light emitting component in the second direction, and the sixth light emitting component is adjacent to the second light emitting component in the second direction, the third lead is connected to the sixth light emitting component, the fourth lead is connected to the fifth light emitting component, the fifth light emitting component and the sixth light emitting component are connected to two driving leads arranged at opposite sides of the light emitting block, respectively, the two driving leads that are respectively connected to the second light emitting component and the sixth light emitting component are arranged at a same side of the light emitting block, the two driving leads that are respectively connected to the first light emitting component and the fifth light emitting component are arranged at a same side of the light emitting block.

13. A display apparatus, comprising: a display substrate, wherein the display substrate comprises:

a base substrate;

a light emitting block on the base substrate, wherein the light emitting block comprises a plurality of light emitting units, and each of the light emitting units comprises a plurality of light emitting points;

a plurality of branch leads, wherein each of the plurality of branch leads extends in a first direction, wherein one of the plurality of branch leads is connected to at least one of the plurality of light emitting points, the plurality of branch leads comprise a first lead and a second lead, the plurality of light emitting points comprise a first light emitting component and a second light emitting component, the first light emitting component and the second light emitting component are adjacent to each other and are arranged in the first direction, the first lead goes across the first light emitting component and is connected to the second light emitting component, the second lead goes across the second light emitting component and is connected to the first light emitting component, and the first lead and the second lead are two different leads, the display substrate further comprises a plurality of driving leads, wherein each of the plurality of driving leads extends in a second direction, wherein the driving lead is electrically connected to the at least one of the plurality of light emitting points through at least one of the plurality of branch leads and configured to receive a driving signal from a driving circuit, the second direction intersects the first direction, wherein two driving leads among the plurality of driving leads that are respectively connected to the first light emitting component and the second light emitting component are arranged at opposite sides of the light emitting block, respectively.

14. The display apparatus according to claim 13, wherein the plurality of light emitting points further comprise a third light emitting component, wherein the third light emitting component, the first light emitting component, and the second light emitting component are arranged in sequence in the first direction, an orthographic projection of the first lead on the base substrate overlaps with an orthographic projection of the third light emitting component on the base substrate, and an orthographic projection of the second lead on the base substrate is located outside an orthographic projection of the third light emitting component on the base substrate.

15. The display apparatus according to claim 14, wherein the plurality of light emitting points further comprise a fourth light emitting component, wherein the third light emitting component, the first light emitting component, the second light emitting component, and the fourth light emitting component are arranged in sequence in the first direction, an orthographic projection of the second lead on the base substrate overlaps with an orthographic projection of the fourth light emitting component on the base substrate, and an orthographic projection of the first lead on the base substrate is located outside an orthographic projection of the fourth light emitting component on the base substrate.

16. The display apparatus according to claim 13, wherein a spacing between the two driving leads that are respectively connected to the first light emitting component and the second light emitting component is greater than a maximum size of the light emitting block in the first direction.

17. The display apparatus according to claim 13, wherein the plurality of branch leads comprise a third lead and a fourth lead, the plurality of light emitting points comprise a fifth light emitting component and a sixth light emitting component, the fifth light emitting component is adjacent to the first light emitting component in the second direction, and the sixth light emitting component is adjacent to the second light emitting component in the second direction, the third lead is connected to the sixth light emitting component, the fourth lead is connected to the fifth light emitting component, the fifth light emitting component and the sixth light emitting component are connected to two driving leads arranged at opposite sides of the light emitting block, respectively, the two driving leads that are respectively connected to the second light emitting component and the sixth light emitting component are arranged at a same side of the light emitting block, the two driving leads that are respectively connected to the first light emitting component and the fifth light emitting component are arranged at a same side of the light emitting block.

18. A method for driving a display apparatus, the display apparatus comprising: a display substrate, wherein the display substrate comprises:

a base substrate;

a light emitting block on the base substrate, wherein the light emitting block comprises a plurality of light emitting units, and each of the light emitting units comprises a plurality of light emitting points;

a plurality of branch leads, wherein each of the plurality of branch leads extends in a first direction, wherein one of the plurality of branch leads is connected to at least one of the plurality of light emitting points, the method comprising:

receiving a driving signal from a driving circuit through the branch lead, the plurality of branch leads comprise a first lead and a second lead, the plurality of light emitting points comprise a first light emitting component and a second light emitting component, the first light emitting component and the second light emitting component are adjacent to each other and are arranged in the first direction, the first lead goes across the first light emitting component and is connected to the second light emitting component, the second lead goes across the second light emitting component and is connected to the first light emitting component, and the first lead and the second lead are two different leads, the display substrate further comprises a plurality of driving leads, wherein each of the plurality of driving leads extends in a second direction, wherein the driving lead is electrically connected to the at least one of the plurality of light emitting points through at least one of the plurality of branch leads and configured to receive a driving signal from a driving circuit, the second direction intersects the first direction, wherein two driving leads among the plurality of driving leads that are respectively connected to the first light emitting component and the second light emitting component are arranged at opposite sides of the light emitting block, respectively.

19. The method for driving the display apparatus according to claim 18, wherein a spacing between the two driving leads that are respectively connected to the first light emitting component and the second light emitting component is greater than a maximum size of the light emitting block in the first direction.

20. The method for driving the display apparatus according to claim 18, wherein the plurality of branch leads comprise a third lead and a fourth lead, the plurality of light emitting points comprise a fifth light emitting component and a sixth light emitting component, the fifth light emitting component is adjacent to the first light emitting component in the second direction, and the sixth light emitting component is adjacent to the second light emitting component in the second direction, the third lead is connected to the sixth light emitting component, the fourth lead is connected to the fifth light emitting component, the fifth light emitting component and the sixth light emitting component are connected to two driving leads arranged at opposite sides of the light emitting block, respectively, the two driving leads that are respectively connected to the second light emitting component and the sixth light emitting component are arranged at a same side of the light emitting block, the two driving leads that are respectively connected to the first light emitting component and the fifth light emitting component are arranged at a same side of the light emitting block.

* * * * *